United States Patent
Okuno (10) Patent No.: US 9,343,619 B2
(45) Date of Patent: May 17, 2016

(54) GROUP III NITRIDE SEMICONDUCTOR LIGHT-EMITTING DEVICE AND METHOD FOR PRODUCING THE SAME

(71) Applicant: TOYODA GOSEI CO., LTD., Kiyosu-shi (JP)

(72) Inventor: Koji Okuno, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 30 days.

(21) Appl. No.: 14/170,238

(22) Filed: Jan. 31, 2014

(65) Prior Publication Data

US 2014/0225060 A1     Aug. 14, 2014

(30) Foreign Application Priority Data

Feb. 14, 2013   (JP) .................................. 2013-026515

(51) Int. Cl.
*H01L 33/06*     (2010.01)
*H01L 33/32*     (2010.01)

(52) U.S. Cl.
CPC ............... *H01L 33/06* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 7,312,468 B2 * | 12/2007 | Watanabe et al. | 257/14 |
| 7,781,777 B2 * | 8/2010 | Yasuda et al. | 257/79 |
| 2013/0112943 A1 * | 5/2013 | Tanaka et al. | 257/13 |
| 2014/0023103 A1 * | 1/2014 | Kasugai et al. | 372/44.01 |

FOREIGN PATENT DOCUMENTS

| | | | | |
|---|---|---|---|---|
| CN | 103746052 A | * | 4/2014 | ............. H01L 33/06 |
| JP | 2005-183524 A | | 7/2005 | |
| JP | 2007-305965 A | | 11/2007 | |

* cited by examiner

*Primary Examiner* — Yu Chen
*Assistant Examiner* — Nilufa Rahim
(74) *Attorney, Agent, or Firm* — McGinn IP Law Group, PLLC (57) ABSTRACT

The present invention provides a Group III nitride semiconductor light-emitting device exhibiting high light efficiency achieved by relaxing a piezoelectric field generated in a light-emitting layer without deteriorating the crystal quality of the light-emitting layer, and a method for producing the same. The light-emitting device has a light-emitting layer in which layer units are repeatedly deposited. Each layer unit comprises an AlGaN layer, an n-type InGaN layer, an InGaN layer, a GaN layer, and an AlGaN layer which are deposited in this order on the n-side superlattice layer. The n-type InGaN layer is doped with Si at a Si concentration of $1\times10^{17}/cm^3$ to $3\times10^{18}/cm^3$.

14 Claims, 8 Drawing Sheets

FIG. 10

GROUP III NITRIDE SEMICONDUCTOR LIGHT-EMITTING DEVICE AND METHOD FOR PRODUCING THE SAME

BACKGROUND OF THE INVENTION

1. Field of the Invention

The present invention relates to a Group III nitride semiconductor light-emitting device and to a method for producing the same. More particularly, the present invention relates to a Group III nitride semiconductor light-emitting device in which a piezoelectric field generated in the light-emitting layer is relaxed, and to a method for producing the same.

2. Background Art

Generally, Group III nitride semiconductor light-emitting devices are produced through epitaxial growth of a Group III nitride semiconductor from a growth substrate. In this process, a plurality of Group III nitride semiconductor layers having different lattice constants is formed. Due to the lattice constant difference, stress generates in a relevant semiconductor layer. The stress generates a piezoelectric field, which declines the potential of the quantum well of the light-emitting layer, thereby spatially separating electrons from holes. As a result, the probability of recombination between electrons and holes in the light-emitting layer decreases. In this case, light emission efficiency of the semiconductor light-emitting device drops.

In order to counteract the piezoelectric field generated in the light-emitting layer, some techniques have been developed. Japanese Patent Application Laid-Open (kokai) No. 2007-305965 discloses a technique of forming a Si-doped GaN layer adjacent to an InGaN layer as a well layer (refer to FIG. 6). The GaN layer generates an electric field in the opposite direction to the piezoelectric field, and relaxes the strain of the InGaN layer as the well layer.

However, when the GaN layer is doped with Si, the crystal quality of the GaN layer is comparatively deteriorated. The deteriorated crystal quality is inherited by the well layer formed on the GaN layer. Thus, the crystal quality is deteriorated due to the formation of Si-doped GaN layer, causing a reduction in the light emission efficiency. In other words, the effect to counteract the piezoelectric field is in a trade-off relation with the achievement of high crystal quality.

The present inventors founded that the piezoelectric field can be counteracted while preventing the deterioration of crystal quality by forming a Si-doped InGaN layer having a small In composition ratio instead of the Si-doped GaN layer. In the InGaN layer having a small In composition ratio, In atoms easily migrate even at a low-temperature. Therefore, the crystal quality is not much deteriorated by Si doping.

SUMMARY OF THE INVENTION

The present invention has been accomplished for solving the aforementioned problems involved in conventional techniques. Accordingly, an object of the present invention is to provide a Group III nitride semiconductor light-emitting device in which a piezoelectric field generated in the light-emitting layer is relaxed without deteriorating the crystal quality of the light-emitting layer, to thereby attain high light emission efficiency. Another object is to provide a method for producing the Group III nitride semiconductor light-emitting device.

Accordingly, in a first aspect of the present invention, there is provided a Group III nitride semiconductor light-emitting device comprising a light-emitting layer having at least one layer unit, an n-type semiconductor layer, and a p-type semiconductor layer. The layer unit has at least a well layer and a barrier layer. The well layer has a first semiconductor layer, and a second semiconductor layer disposed in the n-type semiconductor layer side of the well layer. The first semiconductor layer is a layer of Group III nitride semiconductor comprising at least In and Ga. The second semiconductor layer is an n-type semiconductor layer of Si-doped Group III nitride semiconductor comprising at least In and Ga.

In the Group III nitride semiconductor light-emitting device, electrons are emitted from the doped Si of the second semiconductor layer. As a result, the piezoelectric field generated in the well layer of the light-emitting layer can be weakened. Thus, the potential inclination of valence band and conduction band in the band structure of the light-emitting layer, i.e., Quantum-Confined Stark effect (QCSE) is reduced. The overlapping of wave functions of electrons and holes is increased in the well layer. That is, recombination of electrons and holes is promoted, and the light emission efficiency of the light-emitting device is higher than that of a conventional light-emitting device. The degree of deterioration of the crystal quality is small because the layer doped with Si is a layer containing In.

A second aspect of the present invention is drawn to a specific embodiment of the Group III nitride semiconductor light-emitting device, wherein the second semiconductor layer is disposed adjacent to the first semiconductor layer.

A third aspect of the present invention is drawn to a specific embodiment of the Group III nitride semiconductor light-emitting device, wherein the first semiconductor layer is a non-doped InGaN layer, and the second semiconductor layer is an n-type InGaN layer. The degree of deterioration of the crystal quality is small because the layer doped with Si is an InGaN layer.

A fourth aspect of the present invention is drawn to a specific embodiment of the Group III nitride semiconductor light-emitting device, wherein the well layer has a third semiconductor layer disposed between the first semiconductor layer and the second semiconductor layer. The third semiconductor layer is a layer of Group III nitride semiconductor containing at least In and Ga. The In composition ratio of the third semiconductor layer is equal to or lower than that of the first semiconductor layer, and gradually increases as closer to the first semiconductor layer. Therefore, the stress applied to the well layer is further small. Thus, the piezoelectric field itself is small compared to that of a conventional light-emitting device.

A fifth aspect of the present invention is drawn to a specific embodiment of the Group III nitride semiconductor light-emitting device, wherein the first semiconductor layer is a non-doped InGaN layer, the second semiconductor layer is an n-type InGaN layer, and the third semiconductor layer is a non-doped InGaN layer. The degree of deterioration of the crystal quality is small because the layer doped with Si is an InGaN layer.

A sixth aspect of the present invention is drawn to a specific embodiment of the Group III nitride semiconductor light-emitting device, wherein the average In composition ratio Y of the second semiconductor layer in a thickness direction falls within a range of 0.5% to 50% of the In composition ratio X of the first semiconductor layer in the case that the layer unit comprises no third semiconductor layer, and the In composition ratio Y of the second semiconductor layer falls within a range of 0.5% to 50% of the In composition ratio X of the first semiconductor layer in the case that the layer unit comprises the third semiconductor layer. Thus, the In composition ratio of the second semiconductor layer is lower than that of the first semiconductor layer.

A seventh aspect of the present invention is drawn to a specific embodiment of the Group III nitride semiconductor light-emitting device, wherein each layer unit comprises a first AlGaN layer disposed adjacent to the n-type semiconductor layer side of the second semiconductor layer, a GaN layer disposed adjacent to the p-type semiconductor layer side of the first semiconductor layer, and a second AlGaN layer disposed adjacent to the p-type semiconductor layer side of the GaN layer. The first AlGaN layer serves as a barrier layer. Moreover, during production, the GaN layer and the second AlGaN layer protect the first semiconductor layer from heat. Therefore, the In atoms are difficult to separate from the first semiconductor layer.

An eighth aspect of the present invention is drawn to a specific embodiment of the Group III nitride semiconductor light-emitting device, wherein the Si concentration of the second semiconductor layer falls within a range of $1 \times 10^{17}/cm^3$ to $3 \times 10^{18}/cm^3$.

An ninth aspect of the present invention is drawn to a specific embodiment of the Group III nitride semiconductor light-emitting device, wherein the thickness of the second semiconductor layer falls within a range of 2 Å to 10 Å.

A tenth aspect of the present invention is drawn to a specific embodiment of the Group III nitride semiconductor light-emitting device, wherein the light-emitting layer has a multiple quantum well layer in which layer units are repeatedly deposited.

In an eleventh aspect of the present invention, there is provided a method for producing a Group III nitride semiconductor light-emitting device comprising: forming an n-type semiconductor layer; forming a light-emitting layer on the n-type semiconductor layer; and forming a p-type semiconductor layer on the light-emitting layer. In formation of the light-emitting layer, at least one layer unit having a well layer is formed. At the formation of the layer unit, a first semiconductor layer is formed in a position close to the p-type semiconductor layer of the well layer, and a second semiconductor layer is formed in a position close to the n-type semiconductor layer of the well layer. The first semiconductor layer is a layer of Group III nitride semiconductor containing at least In and Ga. The second semiconductor layer is an n-type semiconductor layer of Si-doped Group III nitride semiconductor containing at least In and Ga.

Through employment of the method for producing a Group III nitride semiconductor light-emitting device, the piezoelectric field generated in the well layer of the light-emitting layer of the light-emitting device can be weakened. The overlapping of wave functions of electrons and holes can be increased in the well layer. Thus, the light emission efficiency of the light-emitting device can be higher than that of a conventional light-emitting device.

A twelfth aspect of the present invention is drawn to a specific embodiment of the method for producing a Group III nitride semiconductor light-emitting device, wherein, in formation of the light-emitting layer, at the formation of each layer unit, a third semiconductor layer is formed between the first semiconductor layer and the second semiconductor layer, by increasing the In composition ratio of the third semiconductor layer as closer to the first semiconductor layer. In the thus-produced Group III nitride semiconductor light-emitting device, the strain applied to the well layer is further small.

A thirteenth aspect of the present invention is drawn to a specific embodiment of the method for producing a Group III nitride semiconductor light-emitting device, wherein, in formation of the light-emitting layer, at the formation of each layer unit, the average In composition ratio Y of the second semiconductor layer in a thickness direction falls within a range of 0.5% to 50% of the In composition ratio X of the first semiconductor layer in the case that the layer unit comprises no third semiconductor layer, and the In composition ratio Y of the second semiconductor layer falls within a range of 0.5% to 50% of the In composition ratio X of the first semiconductor layer in the case that the layer unit comprises the third semiconductor layer. Thus, the In composition ratio of the second semiconductor layer is lower than that of the first semiconductor layer.

A fourteenth aspect of the present invention is drawn to a specific embodiment of the method for producing a Group III nitride semiconductor light-emitting device, wherein, in formation of the light-emitting layer, at the formation of each layer unit, the first AlGaN layer, the second semiconductor layer, the first semiconductor layer, the GaN layer, and the second AlGaN layer are formed in this order. During production, the GaN layer and the second AlGaN layer protect the first semiconductor layer from heat. Thus, the In atoms are difficult to separate from the first semiconductor layer.

A fifteenth aspect of the present invention is drawn to a specific embodiment of the method for producing a Group III nitride semiconductor light-emitting device, wherein, in formation of the light-emitting layer, the substrate temperature at the formation of a layer other than the first AlGaN layer is set to a first substrate temperature, and the substrate temperature at the formation of the first AlGaN layer is set to a second substrate temperature which is higher than the first substrate temperature. Thus, damage by heat to the well layer under an environment of the second substrate temperature can be reduced.

A sixteenth aspect of the present invention is drawn to a specific embodiment of the method for producing a Group III nitride semiconductor light-emitting device, wherein, in formation of the light-emitting layer, the second semiconductor layer is formed by doping Si at a Si concentration of $1 \times 10^{17}/cm^3$ to $3 \times 10^{18}/cm^3$.

A seventeenth aspect of the present invention is drawn to a specific embodiment of the method for producing a Group III nitride semiconductor light-emitting device, wherein, in formation of the light-emitting layer, the second semiconductor layer is formed so as to have a thickness of 2 Å to 10 Å.

The present invention enables provision of a Group III nitride semiconductor light-emitting device in which the piezoelectric field generated in the light-emitting layer is relaxed without deteriorating the crystal quality of the light-emitting layer, to thereby attain high light emission efficiency, and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

Specific embodiments of the present invention will next be described with reference to the drawings by taking, as an example, the case where a semiconductor light-emitting device is produced. However, the present invention is not limited to the embodiments.

Needless to say, the structures of the layers and electrodes forming the below-mentioned light-emitting devices are merely examples, and may differ from those exemplified in the below-described embodiments. The thickness of each layer, which is schematically shown in the drawings, does not correspond to its actual value.

EMBODIMENT 1

1. Semiconductor Light-Emitting Device

Figure 1:
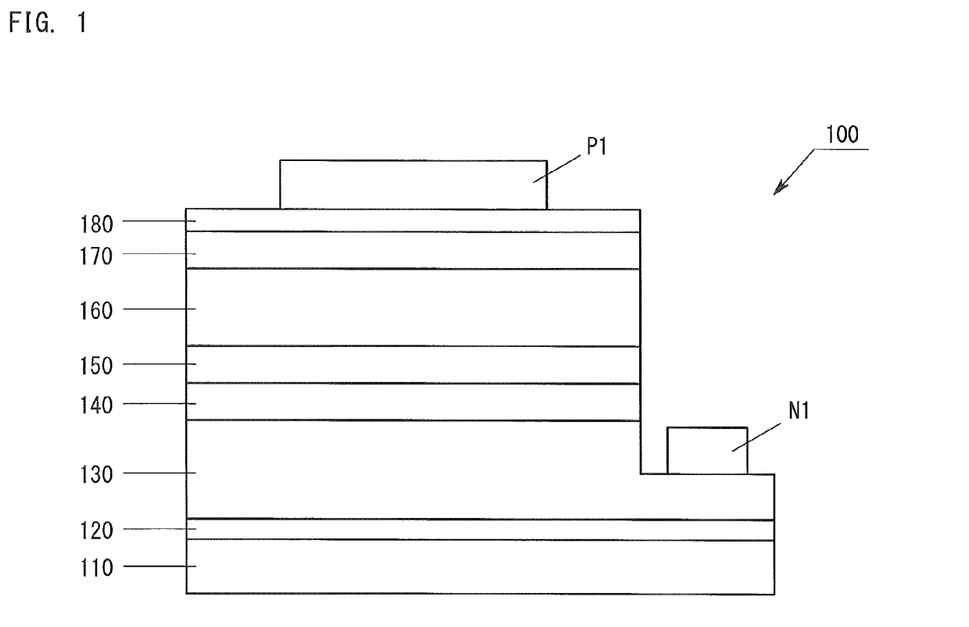
FIG. 1 is a schematic view of the structure of a light-emitting device according to an embodiment.

FIG. 1 shows the structure of a semiconductor light-emitting device 100 according to the present embodiment. The light-emitting device 100 is a face-up-type semiconductor light-emitting device. The light-emitting device 100 has a plurality of semiconductor layers formed of a Group III nitride semiconductor. As shown in FIG. 1, the light-emitting device 100 comprises a substrate 110, a low-temperature buffer layer 120, an n-type contact layer 130, an ESD layer 140, an n-side superlattice layer 150, a light-emitting layer 160, a p-side superlattice layer 170, a p-type contact layer 180, an n-type electrode N1 and a p-type electrode P1.

On the main surface of the substrate 110, semiconductor layers are formed; i.e., the low-temperature buffer layer 120, the n-type contact layer 130, the ESD layer 140, the n-side superlattice layer 150, the light-emitting layer 160, the p-side superlattice layer 170, and the p-type contact layer 180, in this order. The n-type electrode N1 is formed on the n-type contact layer 130, and the p-type electrode P1 is formed on the p-type contact layer 180. The n-type contact layer 130, the ESD layer 140, and the n-side superlattice layer 150 are an n-type semiconductor layer. The p-side superlattice layer 170 and the p-type contact layer 180 are a p-type semiconductor layer. However, these layers may partially contain a non-doped layer.

The substrate 110 serves as a growth substrate having the main surface on which the above-mentioned semiconductor layers are formed by MOCVD. Preferably, the surface of the substrate has irregularities thereon. The substrate 110 is made of sapphire. Other than sapphire, materials such as SiC, ZnO, Si, and GaN may be used.

The low-temperature buffer layer 120 is formed on the main surface of the substrate 110. The low-temperature buffer layer 120 is employed so as to form high density crystal nuclei on the sapphire substrate 110. By virtue of the low-temperature buffer layer 120, growth of a GaN layer having a flat surface is promoted. The low-temperature buffer layer 120 is made of a material such as AlN or GaN.

The n-type contact layer 130 is located beneath the n-type electrode N1. The n-type contact layer 130 is in ohmic contact with the n-type electrode N1. The n-type contact layer 130 is formed on the low-temperature buffer layer 120. The n-type contact layer 130 is an n-type GaN having a Si concentration of $1\times10^{18}/cm^3$ or more. The n-type contact layer 130 may be formed of a plurality of layers having different carrier concentrations for the purpose of enhancement of ohmic contact with the n-type electrode N1. The thickness of the n-type contact layer 130 is, for example, 4 μm. Needless to say, other thickness values may be employed.

The ESD layer 140 serves as an electrostatic-breakdown-voltage-improving layer for preventing electrostatic breakdown of each semiconductor layer. The ESD layer 140 is formed on the n-type contact layer 130. The ESD layer 140 comprises a non-doped i-GaN layer and a Si-doped n-type GaN layer, which are deposited. The i-GaN layer has a thickness of 300 nm. The n-type GaN layer has a thickness of about 30 nm. The n-type GaN layer has a Si concentration of about $5\times10^{18}/cm^3$.

The n-side superlattice layer 150 serves as a strain-relaxing layer for relaxing the stress applied to the light-emitting layer 160. More specifically, the n-side superlattice layer 150 is an n-side superlattice layer having a superlattice structure. The n-side superlattice layer 150 is formed by repeatedly depositing an InGaN layer and an n-type GaN layer. The number of repetitions is 10 to 20. However, the number may fall outside the range. The InGaN layer of the n-side superlattice layer 150 has an In composition ratio of 2% to 20%. The InGaN layer of the n-side superlattice layer 150 has a thickness of 2 Å to 90 Å. The n-type GaN layer of the n-side superlattice layer 150 has a thickness of 10 Å to 50 Å.

The light-emitting layer 160 emits light through recombination of electrons and holes. The light-emitting layer 160 is formed on the n-side superlattice layer 150. The light-emitting layer comprises at least a well layer and a barrier layer. The layer structure of the light-emitting layer 160 will be later described in details.

The p-side superlattice layer 170 is formed on the light-emitting layer 160. The p-side superlattice layer 170 is formed by repeatedly depositing a p-type GaN layer, a p-type AlGaN layer, and a p-type InGaN layer. The number of repetitions is, for example, 5. The p-type GaN layer of the p-side superlattice layer 170 has a thickness of 5 Å to 70 Å. The p-type AlGaN layer of the p-side superlattice layer 170 has an Al composition ratio of 5% to 40%. The p-type AlGaN layer of the p-side superlattice layer 170 has a thickness of 5 Å to 70 Å. The p-type InGaN layer of the p-side superlattice layer 170 has an In composition ratio of 2% to 20%. The p-type InGaN layer of the p-side superlattice layer 170 has a thickness of 10 Å to 70 Å. These values are merely examples, and other values may be employed. Also, another layer structure may be employed.

The p-type contact layer 180 is formed on the p-side superlattice layer 170. The p-type contact layer 180 is provided so as to establish ohmic contact with the p-type electrode P1. The p-type contact layer 180 has a thickness of 80 nm. The p-type contact layer 180 is doped with Mg at an Mg concentration of $1\times10^{19}/cm^3$ to $1\times10^{22}/cm^3$.

The p-type electrode P1 is formed on the p-type contact layer 180. The p-type electrode P1 is in ohmic contact with the p-type contact layer 180. The p-type electrode P1 is made of ITO. Other than ITO, transparent conductive oxide such as ICO, IZO, ZnO, $TiO_2$, $NbTiO_2$, and $TaTiO_2$ may be used. A metal electrode may be formed on the p-type electrode P1 or other electrode may be formed on the p-type electrode P1.

The n-type electrode N1 is formed on the n-type contact layer 130. The n-type electrode N1 is in ohmic contact with the n-type contact layer 130. The n-type electrode N1 is formed by sequentially forming V film and Al film on the n-type contact layer 130. Alternatively, the n-type electrode N1 may be formed by sequentially forming Ti film and Al film or Ti film and Au film.

2. Structure of Light-Emitting Layer

Figure 2:
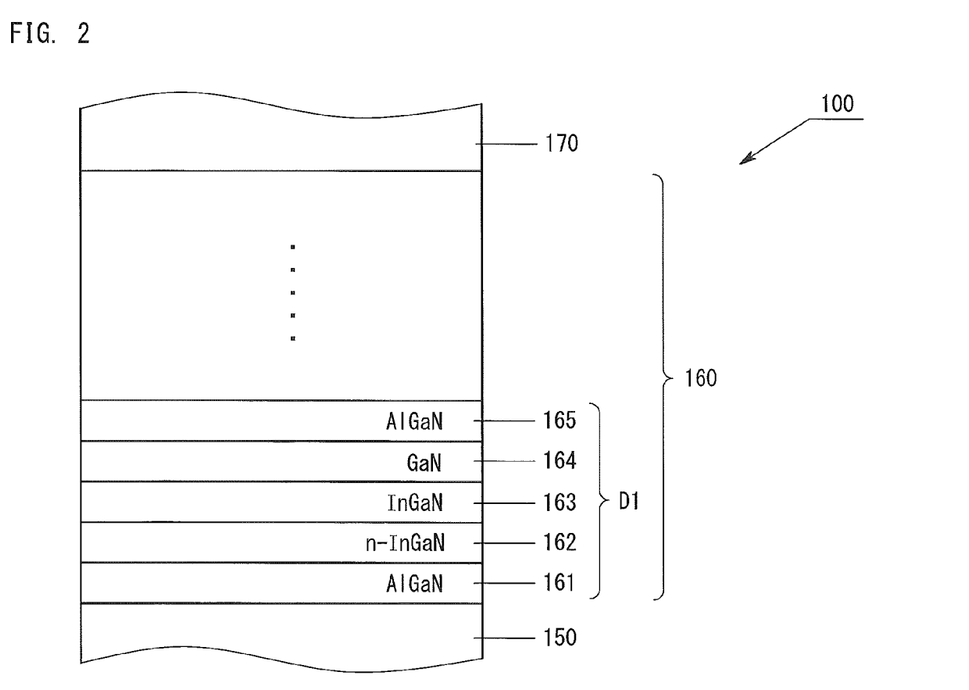
FIG. 2 is a schematic view of the layer structure of the light-emitting layer of a light-emitting device according to Embodiment 1.

FIG. 2 shows the layer structure of the light-emitting layer 160. The light-emitting layer 160 has a multiple quantum well structure in which layer units D1 are repeatedly deposited. The number of repetitions is preferably 3 to 12. Other number of repetitions may be employed. Each layer unit D1 comprises a non-doped AlGaN layer 161, an n-type InGaN layer 162, a non-doped InGaN layer 163, a non-doped GaN layer 164, and a non-doped AlGaN layer 165 which are deposited in this order on the n-side superlattice layer 150.

The AlGaN layer 161 is a barrier layer. The n-type InGaN layer 162 and the InGaN layer 163 are a well layer. The GaN layer 164 and the AlGaN layer 165 serve as a layer to protect the InGaN layer 163 from heat when forming the AlGaN layer 161, that is, to prevent In atoms from being separated from the semiconductor layer due to heat. The n-type InGaN layer 162 is a layer that plays the role of counteracting the piezoelectric field generated in the light-emitting layer 160 and weakening the piezoelectric field.

Thus, the well layer comprises the n-type InGaN layer 162 and the non-doped InGaN layer 163. Recombination of electrons and holes occurs mainly in the InGaN layer 163. The InGaN layer 163 is a first semiconductor layer containing at least In and Ga. The n-type InGaN layer 162 is a second semiconductor layer containing at least In and Ga. The n-type InGaN layer 162 is disposed on the n-type semiconductor layer side of the well layer. The n-type InGaN layer 162 is disposed adjacent to the InGaN layer 163.

The AlGaN layer 161 is a first AlGaN layer disposed adjacent to the n-type semiconductor layer side of the n-type InGaN layer 162. The non-doped GaN layer 164 is disposed adjacent to the p-type semiconductor layer side of the InGaN layer 163. The AlGaN layer 165 is a second AlGaN layer disposed adjacent to the p-type semiconductor layer side of the GaN layer 164.

The AlGaN layer 161 has a thickness of 10 Å to 100 Å. The n-type InGaN layer 162 has a thickness of 2 Å to 10 Å. The InGaN layer 163 has a thickness of 5 Å to 60 Å. The GaN layer 164 has a thickness of 2 Å to 8 Å. The AlGaN layer 165 has a thickness of 2 Å to 8 Å.

The n-type InGaN layer 162 is doped with Si at a Si concentration of $1 \times 10^{17}/cm^3$ to $3 \times 10^{18}/cm^3$. Particularly, the Si concentration is more preferably $5 \times 10^{17}/cm^3$ to $1 \times 10^{18}/cm^3$. The In composition ratio Y of the n-type InGaN layer 162 is 0.5% to 50% of the In composition ratio X of the InGaN layer 163. Here, the In composition ratio X of the InGaN layer 163 is 0.1 to 0.5. The In composition ratio Y of the n-type InGaN layer 162 is smaller than the In composition ratio X of the InGaN layer 163. However, emission wavelength changes by varying the thickness and the In composition ratio of the n-type InGaN layer 162. Therefore, the n-type InGaN layer 162 belongs to the well layer.

As mentioned above, the thickness of the n-type InGaN layer 162 is 2 Å to 10 Å. The Si concentration of the n-type InGaN layer 162 is $1 \times 10^{17}/cm^3$ to $3 \times 10^{19}/cm^3$. Therefore, the Si sheet density defined as the product of these values (the Si concentration of the semiconductor layer×the thickness of the semiconductor layer) of the n-type InGaN layer 162 is $2 \times 10^9/cm^2$ to $3 \times 10^{11}/cm^2$.

Thus, the n-type InGaN layer 162 is doped with Si. An electric field is generated in a direction to counteract the piezoelectric field. As a result, the inclination of the band structure of the light-emitting layer 160, i.e., Quantum-Confined Stark Effect (QCSE) is reduced. Therefore, in the InGaN layer 163 as the well layer, the wave functions of electrons and holes are often superposed, that is, the light is easily emitted. This mechanism will be described later.

3. Method for Producing Semiconductor Light-Emitting Device

The method for producing the light-emitting device 100 according to this embodiment will be described. The aforementioned respective semiconductor layers are formed through epitaxial crystal growth by metal-organic chemical vapor deposition (MOCVD). The method for producing the light-emitting device 100 comprises the steps of forming an n-type semiconductor layer; forming a light-emitting layer on the n-type semiconductor layer; and forming a p-type semiconductor layer on the light-emitting layer.

The carrier gas employed in the method is hydrogen ($H_2$), nitrogen ($N_2$), or a gas mixture of hydrogen and nitrogen ($H_2+N_2$). Ammonia gas ($NH_3$) is employed as a nitrogen source. Trimethylgallium ($Ga(CH_3)_3$: hereinafter referred to as "TMG") is employed as a Ga source. Trimethylindium ($In(CH_3)_3$: hereinafter referred to as "TMI") is employed as an In source. Trimethylaluminum ($Al(CH_3)_3$: hereinafter referred to as "TMA") is employed as an Al source. Silane ($SiH_4$) is employed as an n-type dopant gas. Cyclopentadienylmagnesium ($Mg(C_5H_5)_2$) is employed as a p-type dopant gas.

3-1. n-Type Contact Layer Formation Step

Firstly, the low-temperature buffer layer 120 is formed on the main surface of the substrate 110. On the buffer layer 120, the n-type contact layer 130 is formed. The substrate temperature in this step is adjusted to 1,080° C. to 1,140° C. The Si concentration is $1 \times 10^{18}/cm^3$ or more.

3-2. Electrostatic-Breakdown-Voltage-Improving Layer Formation Step

Then, the ESD layer 140 is formed. To form an i-GaN layer, the supply of silane ($SiH_4$) is stopped. The substrate temperature in this process is adjusted to 750° C. to 950° C. To form an n-type GaN, silane ($SiH_4$) is supplied again. The substrate temperature in this process is adjusted to fall within the same range as employed in the i-GaN layer formation step, i.e. 750° C. to 950° C.

3-3. n-Side Superlattice Layer Formation Step

Then, the n-side superlattice layer 150 is formed. Firstly, the InGaN layer is formed on the ESD layer 140, and then the n-type GaN layer is formed on the InGaN layer. Then, the combination of the InGaN layer and the n-type GaN layer is repeatedly formed. The substrate temperature at the formation of the InGaN layer is 700° C. to 950° C. The substrate temperature at the formation of the n-type GaN layer is 700° C. to 950° C.

3-4. Light-Emitting Layer Formation Step

Subsequently, the light-emitting layer 160 is formed on the n-side superlattice layer 150. The aforementioned layer unit D1 is repeatedly formed. Specifically, the InGaN layer 163 is formed in a position close to the p-type semiconductor layer, and the n-type InGaN layer 162 is formed in a position close to the n-type semiconductor layer.

In this step, the substrate temperature is adjusted to 700° C. to 900° C., for example, 800° C. The n-type InGaN layer 162, the InGaN layer 163, the GaN layer 164, and the AlGaN layer 165 are formed at the same temperature. Therefore, when depositing these layers, the substrate temperature is maintained at a constant temperature. The AlGaN layer 161 is formed at a temperature higher than that of the n-type InGaN layer 162, the InGaN layer 163, the GaN layer 164, and the AlGaN layer 165. The formation temperature of the AlGaN layer 161 is preferably, for example 900° C., within a range of 800° C. to 950° C.

Figure 3:
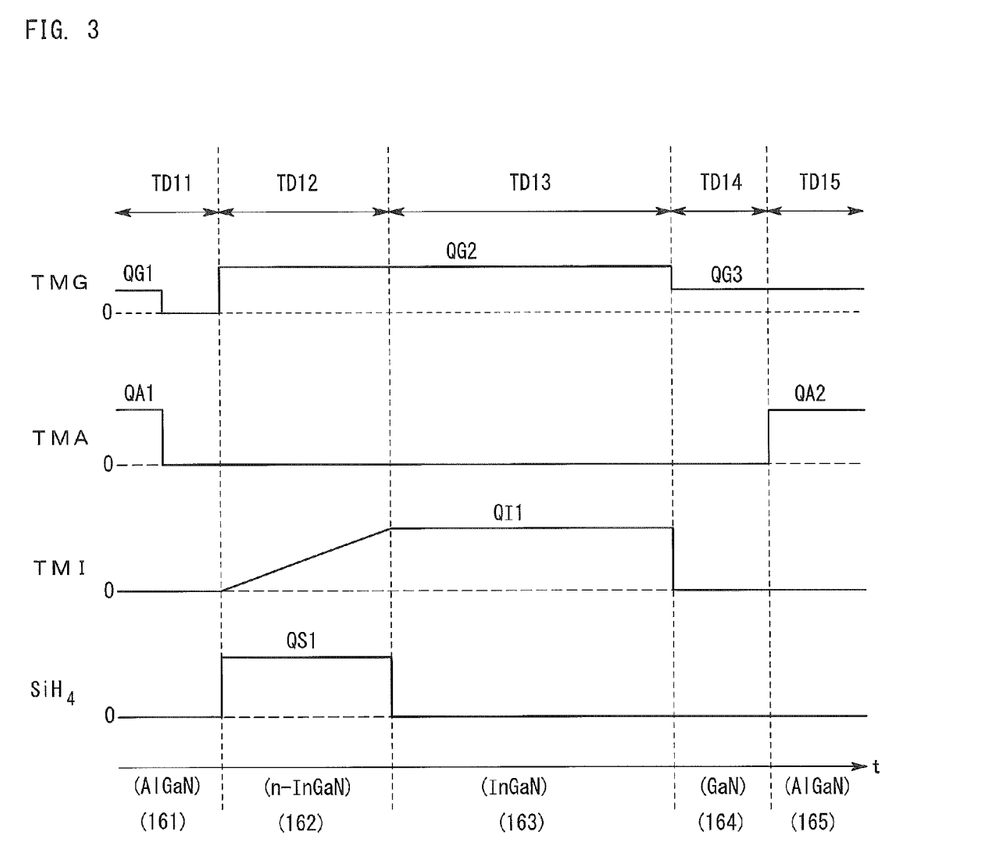
FIG. 3 is a diagram illustrating the method for producing the light-emitting layer of the light-emitting device according to Embodiment 1.

FIG. 3 is a diagram showing the changes in the supply amounts of the raw material gases in the light-emitting layer formation step, in which the supply profiles of the raw material gases when only one layer unit D of the light-emitting layer 160 is formed. The horizontal axis of FIG. 3 represents time. Firstly, the AlGaN layer 161 is formed. During the period TD11 while the AlGaN layer 161 is formed, TMG is supplied at the amount QG1, and TMA is supplied at the amount QA1. The supply of TMI and silane ($SiH_4$) are kept stopped. The substrate temperature, i.e., the second substrate temperature, falls within the aforementioned temperature range, for example, 900° C. in the former half of the period TD11. In the latter half of the period TD11, the substrate temperature is gradually decreased to the first substrate temperature. In this temperature falling time, the supply of TMG and TMA is stopped.

During the period TD12 while the n-type InGaN layer 162 is formed, the substrate temperature is kept at the first substrate temperature. The first substrate temperature falls within the aforementioned temperature range, for example, 800° C. With the supply of TMA stopped, TMG is supplied at the amount QG2. The supply amount QG2 is larger than the supply amount QG1. The supply amount of TMI is gradually increased to the amount QI1 at which the InGaN layer 163 is to be formed. Then, silane ($SiH_4$) is supplied at the amount QS1. When depositing the light-emitting layer 160, silane ($SiH_4$) is supplied only during the period TD12 while the n-type InGaN layer 162 is formed.

During the period TD13 while the InGaN layer 163 is formed, the supply of silane ($SiH_4$) is stopped, and TMI is supplied at the amount QI1. The supply of TMI is stopped before forming the GaN layer 164. In FIG. 3, the supply amount QI1 is maintained just before the time when the period TD13 is finished. However, as the period TD13 comes to the end, the supply amount of TMI may be gradually decreased.

During the period TD14 while the GaN layer 164 is formed, TMG is supplied at the amount QG3, and the supply of TMI is stopped. The supply amount QG3 is slightly smaller than the supply amount QG1.

During the period TD15 while the AlGaN layer 165 is formed, TMA is supplied at the amount QA2. In the total processes in FIG. 3 and the above description, ammonia gas as a nitrogen source continues to be supplied even in the temperature rising or falling time. This is to prevent N atoms from evaporating again from the crystal surface during the temperature rising or falling time. By the supply of the above gases, the layer unit D1 can be formed. Through the repetition of formation of the layer unit, the light-emitting layer 160 is formed.

3-5. p-Side Superlattice Layer Formation Step

Then, the p-side superlattice layer 170 is formed on the light-emitting layer 160. In this step, the p-type GaN layer, the p-type AlGaN layer, and the p-type InGaN layer are repeatedly deposited.

3-6. p-Type Contact Layer Formation Step

Then, the p-type contact layer 180 is formed on the p-side superlattice layer 170. The substrate temperature is adjusted to 900° C. to 1,050° C. As a result, the above-mentioned semiconductor layers are deposited on the substrate 110.

3-7. Electrode Formation Step

Then, the p-type electrode P1 is formed on the p-type contact layer 180. The semiconductor layer deposited structure is partially removed through laser radiation or etching from the p-type contact layer 100, to thereby expose the n-type contact layer 130. The n-type electrode N1 is formed on the exposed area of the n-type contact layer 130. Formation of the p-type electrode P1 and formation of the n-type electrode N1 may be carried out in any order.

3-8. Other Steps

In addition to the aforementioned steps, insulating film formation for covering the device, thermal treatment, and other steps may be performed. Through carrying out the steps, production of the light-emitting device 100 shown in FIG. 1 is completed.

4. Effects of the Present Embodiment

4-1. Comparison with the Conventional Semiconductor Light-Emitting Device

Figure 4:
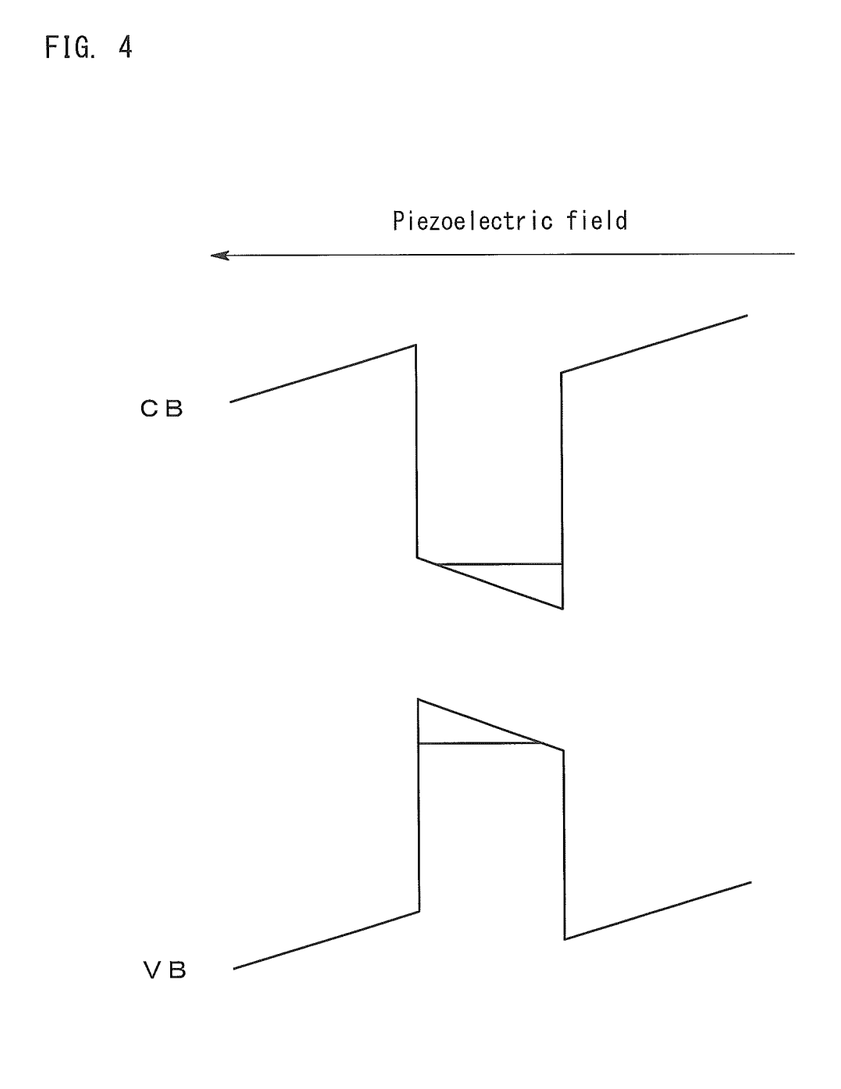
FIG. 4 is a schematic view of the band structure of a conventional light-emitting device.

FIG. 4 is a schematic view of the band structure around the well layer of the light-emitting layer in the conventional light-emitting device. In this case, Valence Band (VB) and Conduction Band (CB) are inclined at a relatively large angle by the piezoelectric field. Therefore, electrons and holes are unevenly distributed in the InGaN layer as the well layer. That is, the superposition of wave functions of electrons and holes is small. As a result, recombination of electrons and holes is relatively hard to occur. This causes the reduction of the light emission efficiency.

Figure 5:
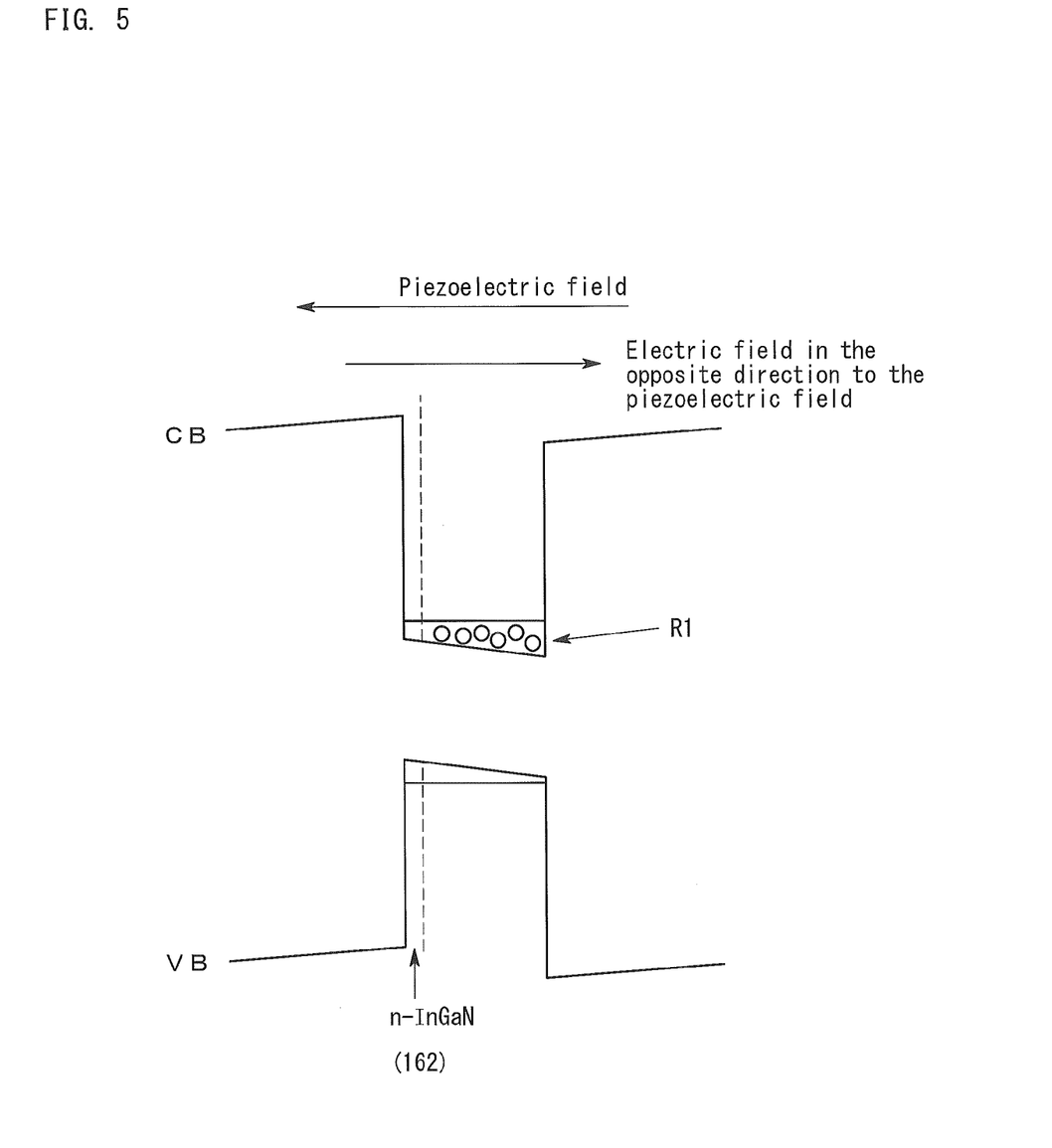
FIG. 5 is a schematic view of the band structure of the light-emitting layer of the light-emitting device according to Embodiment 1.

FIG. 5 is a schematic view of the band structure around the well layer of the light-emitting layer 160 of the light-emitting device 100 according to the present embodiment. Unlike the conventional light-emitting device (refer to FIG. 4), Si of the n-type InGaN layer 162 emits electrons as shown in the area R1 of FIG. 5. Si positively charged by the emission of electrons exists inside the n-type InGaN layer 162, which generates an electric field in the opposite direction to the piezoelectric field. This reduces the electric field applied to the InGaN layer 163 as the well layer. As a result, uneven distribution of electrons and holes is corrected to a certain extent. That is, the superposition of wave functions of electrons and holes is larger than that of a conventional light-emitting device. Therefore, recombination of electrons and holes is easier to occur than in the conventional light-emitting device. The light emission efficiency of the light-emitting device 100 is higher than that of the conventional light-emitting device.

4-2. Comparison with the Case when the GaN is Doped with Si

The present embodiment, the Si-doped n-type InGaN layer 162 is formed adjacent to the InGaN layer 163 as the well layer. In addition, a Si-doped GaN layer may be formed. In that case, however, the crystal quality of the GaN layer is deteriorated, and the deteriorated crystal quality is inherited by the InGaN layer 162 formed. On the contrary, in the present embodiment, Si is doped to the InGaN layer in which atoms migrate well even at a low temperature. Therefore, the piezoelectric field is weakened without deteriorating the crystal quality of the semiconductor layer before the formation of the InGaN layer 162. Thus, the light emission efficiency of the light-emitting device 100 is higher.

5. Modifications

5-1. Filp-Chip Type and Substrate Lift-Off Type

The present embodiment was applied to the face-up type semiconductor light-emitting device. Needless to say, it may be applied to other types of semiconductor light-emitting devices, for example, a flip-chip type having a light extraction surface on the substrate and a substrate lift-off type in which the growth substrate is removed.

5-2. Single Quantum Well Structure (SQW Structure)

In the present embodiment, the light-emitting layer has a Multiple Quantum Well structure (MQW structure). However, the present embodiment may be applied to the light-emitting device having a Single Quantum Well structure (SQW structure) which includes only one well layer. In that case, the light-emitting layer 160 has only one layer unit D1.

5-3. Well Layer Composition

The InGaN layer 163 as the well layer may contain a slight amount of Al. $Al_xIn_yGa_{(1-X-Y)}N$ ($0 \leq X$, $0 < Y$, $X+Y<1$) may be used as the well layer instead of the InGaN layer 163. That is, Group III nitride semiconductor containing at least In and Ga may contain a slight amount of Al. Similarly, the n-type InGaN layer 162 may contain a slight amount of Al.

5-4. In Composition Ratio of n-Type InGaN Layer

The In composition ratio of the n-type InGaN layer 162 is may be constant in a direction of a thickness. In this case it is desirable that the In composition ratio Y of n-type InGaN layer 162 falls within the range of 0.5% to 50% of the In composition ratio X of the InGaN layer 163. Alternatively the In composition ratio of the n-type InGaN layer 162 may be higher as closer to that of the InGaN layer 163. Even in that case, the InGaN layer 163 has the highest In composition ratio. The In composition ratio of the re-type InGaN layer 162 is lower than that of the InGaN layer 163. Also In composition ratio of the n-type InGaN layer 162, which is an average value in a thickness direction, may be within the range of 0.5% to 50% of the In composition ratio of the InGaN layer 163.

6. Summary of the Present Embodiment

As described hereinabove, in the light-emitting device 100 of the present embodiment, the n-type InGaN layer 162 doped with Si was formed adjacent to the side of the InGaN layer 163, which side is nearer to the n-side superlattice layer 150 in the well layer unit D1 of the light-emitting layer 160. Positive ions of Si generate an electric field in a direction to counteract the piezoelectric field. The weakened piezoelectric field suppresses potential inclination. As a result, electrons and holes are efficiently recombined, thereby achieving a semiconductor light-emitting device exhibiting high light emission efficiency.

Since the aforementioned embodiments are merely examples, it should be understood that those skilled in the art can perform various variations and modifications, without deviating the scope of the present invention. The deposit structure of the deposited body is not necessarily limited to those illustrated. The deposit structure, the number of repetitions of the layers, etc. may be determined. The layer formation method is not limited to metal-organic chemical vapor deposition (MOCVD), and any other methods may be employed, so long as the semiconductor crystal growth is performed by use of a carrier gas. That is, semiconductor layers may be formed through liquid-phase epitaxy, molecular-beam epitaxy, or another epitaxial growth technique.

EMBODIMENT 2

Next will be described Embodiment 2. The semiconductor light-emitting device according to the present embodiment is different from Embodiment 1 in the structure and the production method of the light emitting layer. Therefore, only the differences will be described.

1. Light-Emitting Layer

Figure 6:
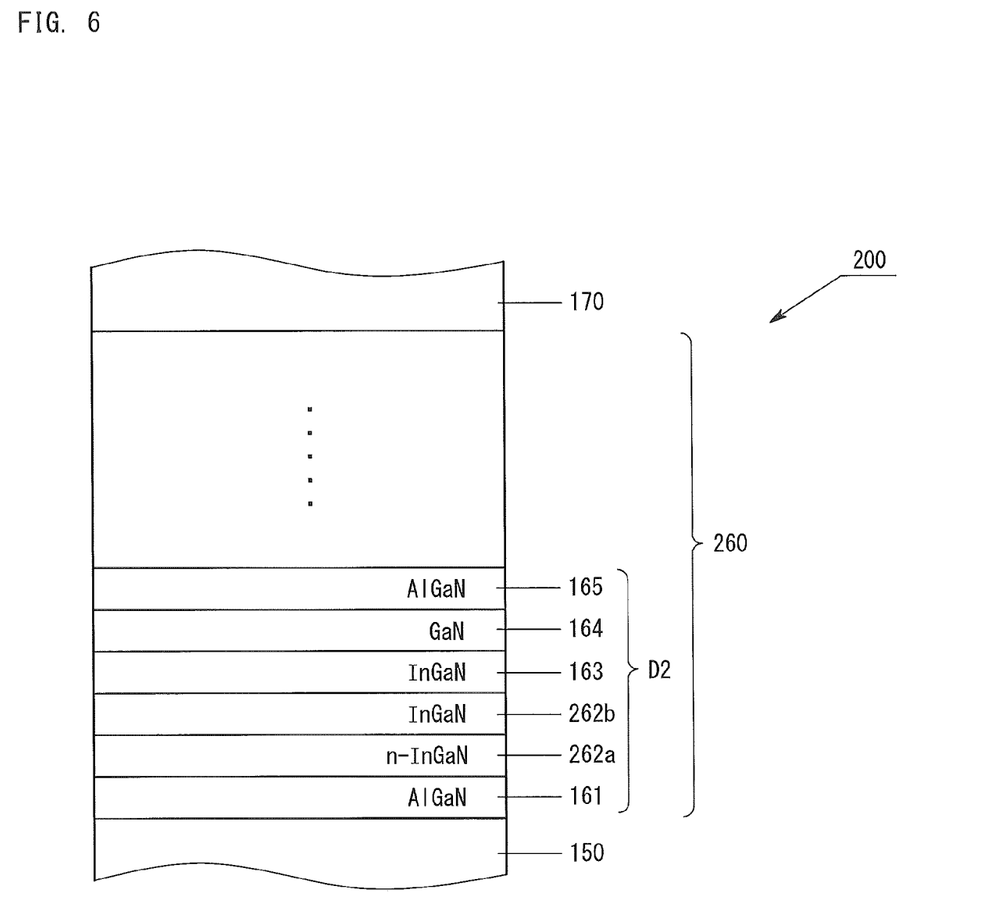
FIG. 6 is a schematic view of the layer structure of the light-emitting layer of a light-emitting device according to Embodiment 2.

The light-emitting device 200 according to the present embodiment has a light-emitting layer 260. The light-emitting device 200 has the same structure as that of the light-emitting device 100 according to Embodiment 1 except for the structure of the light-emitting layer 260. The light-emitting layer 260 is formed by repeatedly depositing layer units D2 as shown in FIG. 6. Each layer unit D2 comprises an AlGaN layer 161, an n-type InGaN layer 262a, an InGaN layer 262b, an InGaN layer 163, a GaN layer 164, and an AlGaN layer 165 which are deposited in this order on the n-side superlattice layer 150.

The AlGaN layer 161, the InGaN layer 163, the GaN layer 164, and the AlGaN layer 165 are non-doped and the same as in Embodiment 1.

Thus, the n-type InGaN layer 262a and the non-doped InGaN layer 262b will be described below. The n-type InGaN layer 262a is formed on the AlGaN layer 161 as a barrier layer. The non-doped InGaN layer 262b is formed on the n-type InGaN layer 262a.

The In composition ratios of the n-type InGaN layer 262a and the non-doped InGaN layer 262b are gradually increased from the AlGaN layer 161 to the non-doped InGaN layer 163. That is, continuously in the n-type InGaN layer 262a and the non-doped InGaN layer 262b, the In composition ratio is lower as closer to the AlGaN layer 161, and higher as closer to the non-doped InGaN layer 163. The In composition ratios of the n-type InGaN layer 262a and the non-doped InGaN layer 262b are equal to or lower than that of the non-doped InGaN layer 163.

The well layer comprises the n-type InGaN layer 262a, the non-doped InGaN layer 262b, and the non-doped InGaN layer 163. Recombination of electrons and holes mainly occurs in the InGaN layer 163. The InGaN layer 163 is a first semiconductor layer containing at least In and Ga. The n-type InGaN layer 262a is a second semiconductor layer containing at least In and Ga. The non-doped InGaN layer 262b is a third semiconductor layer containing at least In and Ga. The n-type InGaN layer 262a is disposed nearer to the side of the n-side superlattice layer 150 in the well layer unit D2. The InGaN layer 262b is disposed between the InGaN layer 163 and the n-type InGaN layer 262a.

2. Effects of the Present Embodiment

The lattice constant of the n-type InGaN layer 262a and the InGaN layer 262b is gradually increases from the AlGaN layer 161 to the InGaN layer 163. Since the lattice constant gradually and smoothly changes, stress generated from the AlGaN layer 161 to the InGaN layer 163 is smaller than that of Embodiment 1. That is, the piezoelectric field generated in the light-emitting layer 260 of the light-emitting device 200 is smaller than the piezoelectric field generated in the light-emitting layer 160 of the light-emitting device 100.

In this way, the piezoelectric field itself generated in the light-emitting layer 260 is relaxed in the present embodiment. Therefore, combined with the effect of counteracting the piezoelectric field by the n-type InGaN layer 262a, the potential inclination of the light-emitting layer 260 is extremely small. As a result, in the InGaN layer 163, the superposition of wave functions of electrons and holes is larger than that of a conventional light-emitting device. That is, the light-emitting device 200 has a higher light emission efficiency than that of a conventional light-emitting device. Moreover, the light-emitting device 200 has a higher light emission efficiency than that of the light-emitting device 100.

3. Light-Emitting Layer Formation Step

Only the formation step of the light-emitting layer 260 in the method for producing the light-emitting device 200 will be described because other steps are the same as those of the embodiment 1.

A light-emitting layer 260 is formed on the n-side superlattice layer 150. The aforementioned layer units D2 are repeatedly formed. In this step, an InGaN layer 262b is formed between an n-type InGaN layer 262a and an InGaN layer 163.

In this step, the substrate temperature is adjusted to 700° C. to 900° C., for example, 800° C. The n-type InGaN layer 262a, the InGaN layer 262b, the InGaN layer 163, the GaN layer 164, and the AlGaN layer 165 are formed at the same temperature. Therefore, when depositing these layers, the substrate temperature is maintained at a constant temperature. The AlGaN layer 161 is formed at a higher temperature than that of the n-type InGaN layer 262a, the InGaN layer 262b, the InGaN layer 163, the GaN layer 164, and the AlGaN layer 165. The formation temperature of the AlGaN layer 161 is preferably, for example, 900° C., within a range of 800° C. to 950° C.

Figure 7:
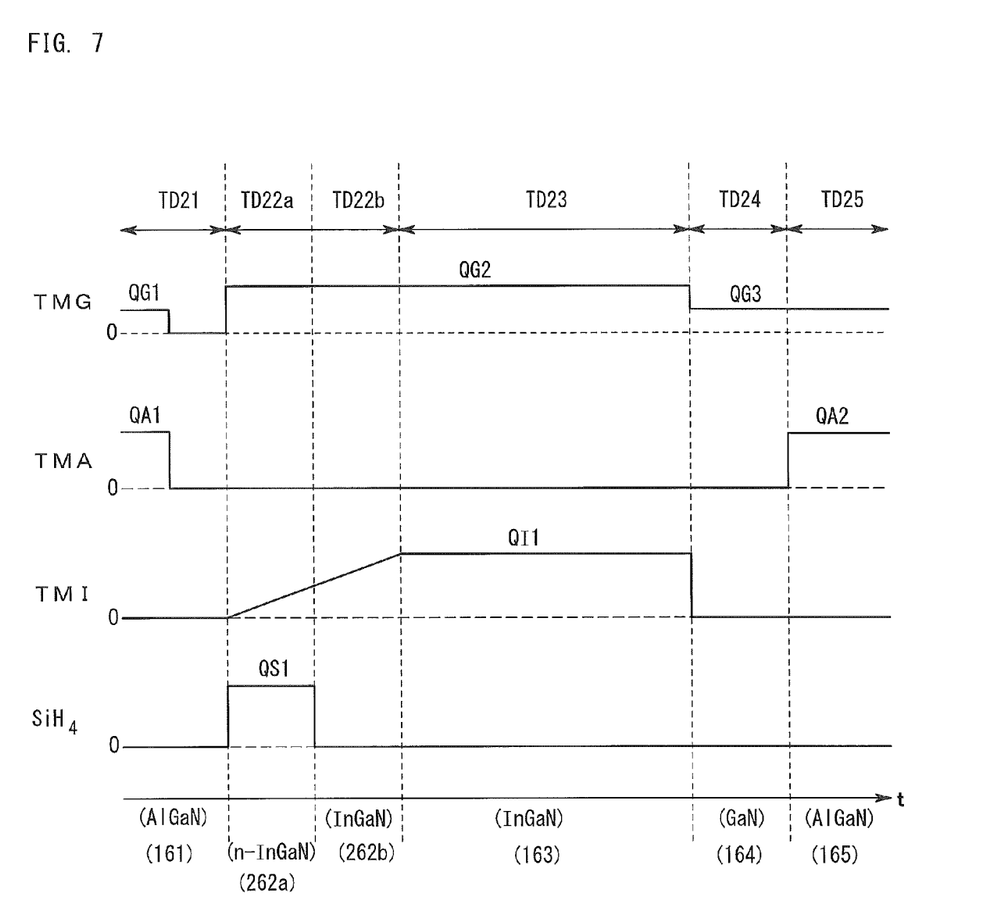
FIG. 7 is a diagram illustrating the method for producing the light-emitting layer of the light-emitting device according to Embodiment 2.

FIG. 7 is a diagram showing the changes in the supply amounts of the raw material gases in the light-emitting layer formation step. FIG. 7 is different from FIG. 3 in that during the period TD22a, silane ($SiR_4$) is supplied at a predetermined flow rate while gradually increasing the supply amount of TMI as an In source, and during the period TD22b, with the supply of silane ($SiR_4$) stopped, the supply amount of TMI as an In source is increased continuously from the period TD22a. Thus, the InGaN layer is formed, of which In composition ratio gradually increases from the AlGaN layer 161 to the InGaN layer 163. The n-type InGaN layer 262a doped with Si is formed on the AlGaN layer 161 side, and the InGaN layer 262b is formed, of which In composition ratio increases as closer to the InGaN layer 163.

4. Summary of the Present Embodiment

As described hereinabove, in the light-emitting device 200 of the present embodiment, the n-type InGaN layer 262a doped with Si and the InGaN layer 262b are formed adjacent to the side of the InGaN layer 163, which side is nearer to the n-side superlattice layer 150 in the well layer unit D2 of the light-emitting layer 260. Positive ions of Si generate an electric field in a direction to counteract the piezoelectric field. The weakened piezoelectric field suppresses potential deformation. As a result, electrons and holes are efficiently recombined, thereby achieving a semiconductor light-emitting device exhibiting high light emission efficiency.

The InGaN layer 262b and the InGaN layer 163 are considered as a single layer because they are only different in the In composition ratio.

EXAMPLE

The experiments performed on the light-emitting device 200 according to embodiment 2 will be described below.

1. Conditions of Example and Comparative Example

1-1. Semiconductor Light-Emitting Device According to an Example

The semiconductor light-emitting device according to an example will be described. As shown in Table 1, the thickness of the AlGaN layer 161 was 25 Å. The thickness of the Si-doped n-type InGaN layer 262a was 8 Å. The total thickness of the InGaN layer 163 and the InGaN layer 262b was 22 Å. The thickness of the GaN layer 164 was 5 Å. The thickness of the AlGaN layer 165 was 5 Å. The light-emitting layer had a Multiple Quantum Well structure (MQW structure) in which layer units D1 were repeatedly deposited nine times. The In composition ratio X of the InGaN layer 163 was 0.2. The In composition ratio Y of the n-type InGaN layer 262a was 0.1. The n-type InGaN layer 262a was doped with Si at a Si concentration of $5\times10^{17}/cm^3$. The Al composition ratio of the AlGaN layer 161 was 0.07. The Al composition ratio of the AlGaN layer 165 was 0.15. The substrate temperature at the formation of the AlGaN layer 161 was 900° C. The substrate temperature at the formation of the layers other than the AlGaN layer 161 of the light-emitting layer 160 was 800° C.

TABLE 1

| | Example | |
|---|---|---|
| AlGaN layer 165 | 5 Å | Non-doped |
| GaN layer 164 | 5 Å | Non-doped |
| InGaN layer 163, 262b | 22 Å | Non-doped |
| n-type InGaN layer 262a | 8 Å | Si-doped |
| AlGaN layer 161 | 25 Å | Non-doped |

1-2. Semiconductor Light-Emitting Device According to a Comparative Example The semiconductor light-emitting device according to a comparative example will be described. Table 2 shows the structure of layer unit of the light-emitting layer in the semiconductor light-emitting device according to the comparative example. Instead of forming the Si-doped n-type InGaN layer 262a in the example, a non-doped InGaN layer was formed. This is the only difference between the example and the comparative example. Other structures are the same as those of the semiconductor light-emitting device according to the example.

TABLE 2

| Comparative Example | | |
|---|---|---|
| AlGaN layer 165 | 5 Å | Non-doped |
| GaN layer 164 | 5 Å | Non-doped |
| InGaN layer 263, 262b | 22 Å | Non-doped |
| InGaN layer | 8 Å | Non-doped |
| AlGaN layer 161 | 25 Å | Non-doped |

2. External Quantum Efficiency ($\eta_{ext.}$)

Figure 8:
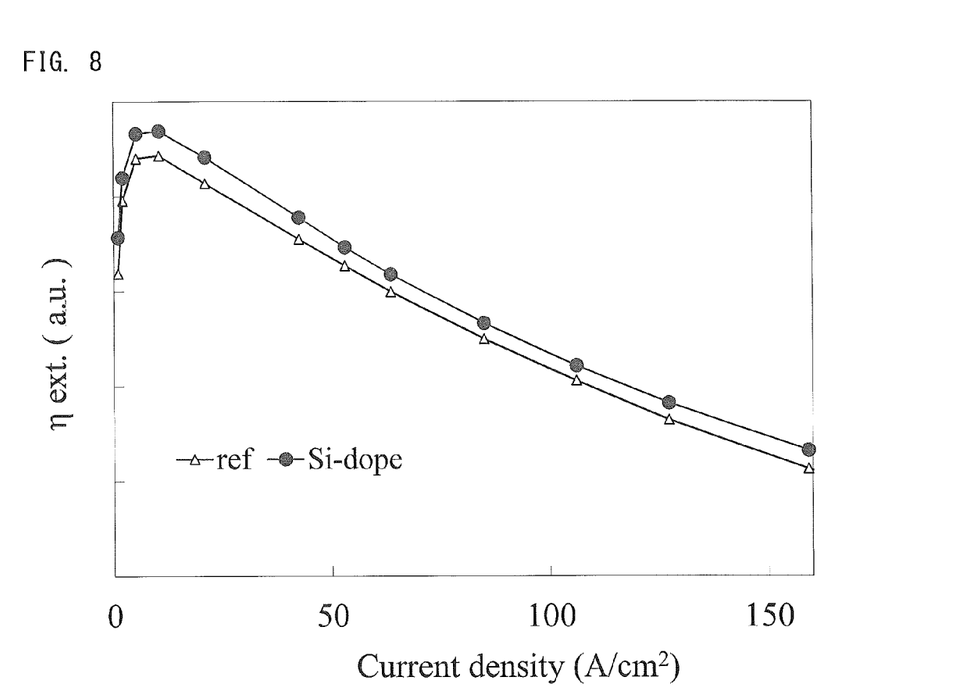
FIG. 8 is a graph comparing the external quantum efficiency between the light-emitting device according to Embodiment 2 and the conventional light-emitting device.

FIG. 8 is a graph showing the current density dependency of an external quantum efficiency ($\eta_{ext.}$)

The horizontal axis of FIG. 8 represents a current density (A/cm$^2$). The vertical axis of FIG. 8 represents external the quantum efficiency ($\eta_{ext.}$). As shown in FIG. 8, the external quantum efficiency ($\eta_{ext.}$) increases as the current density increases, reaches the maximum value at the current density of approx. 10 (A/cm$^2$), and it decreases as the current density increases. Throughout the measured current density range, the external quantum efficiency ($\eta_{ext.}$) of the example is higher than the external quantum efficiency ($\eta_{ext.}$) of the comparative example.

Specifically, as shown in Table 3, the value obtained by dividing η of the example by η of the comparative example is 1.019 when the current density is 53 (A/cm$^2$), 1.017 when the current density is 106 (A/cm$^2$), and 1.030 when the current density is 212 (A/cm$^2$). That is, the external quantum efficiency ($\eta_{ext.}$) is improved as a whole by about 1% to 3% in the semiconductor light-emitting device according to the example compared to the conventional semiconductor light-emitting device.

TABLE 3

| Current density (A/cm$^2$) | η (example)/η (comparative example) |
|---|---|
| 53 | 1.019 |
| 106 | 1.017 |
| 212 | 1.030 |

3. Total Radiant Flux (Po)

Figure 9:
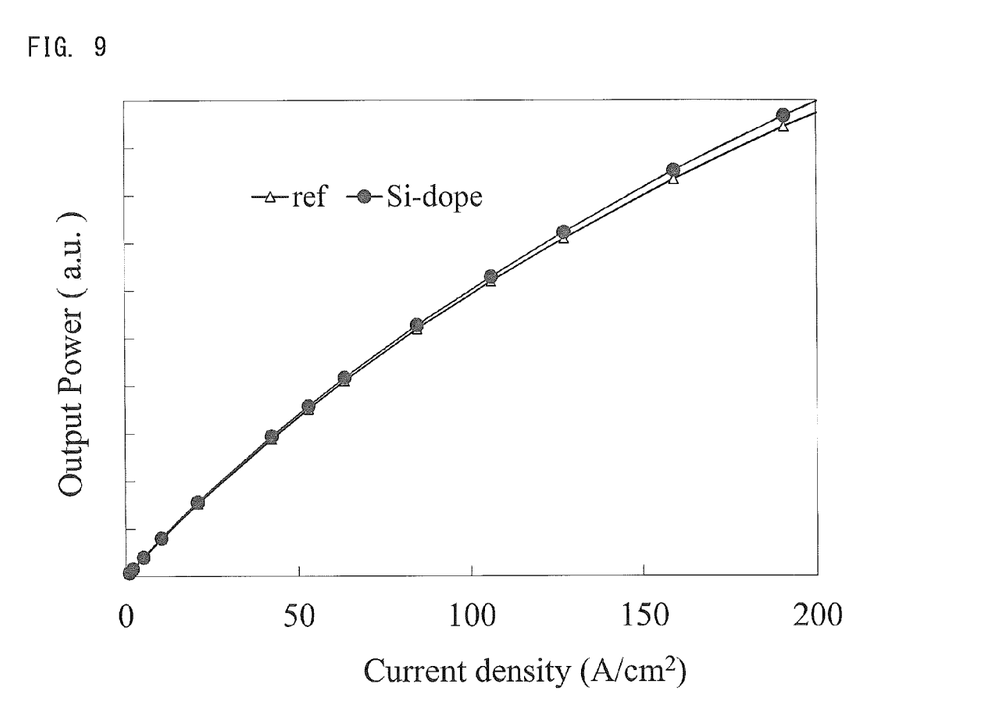
FIG. 9 is a graph comparing the output power between the light-emitting device according to Embodiment 2 and the conventional light-emitting device.

FIG. 9 is a graph showing the current density dependence of total radiant flux (Po). The horizontal axis of FIG. 9 represents a current density (A/cm$^2$). The vertical axis of FIG. 9 represents a total radiant flux (Po). As shown in FIG. 9, the total radiant flux (Po) increases as the current density increases. Throughout the measured current density range, the total radiant flux (Po) of the example is higher than the total radiant flux (Po) of the comparative example.

Specifically, as shown in Table 4, the value obtained by dividing Po of the example by Po of the comparative example is 1.017 when the current density is 53 (A/cm$^2$), 1.015 when the current density is 106 (A/cm$^2$), and 1.023 when the current density is 212 (A/cm$^2$). That is, the total radiant flux (Po) is improved as a whole by about 1% to 3% in the semiconductor light-emitting device according to the example compared to the conventional semiconductor light-emitting device.

TABLE 4

| Current density (A/cm$^2$) | Po (Example)/Po (comparative example) |
|---|---|
| 53 | 1.017 |
| 106 | 1.015 |
| 212 | 1.023 |

4. Wall Plug Efficiency (WPE)

Figure 10:
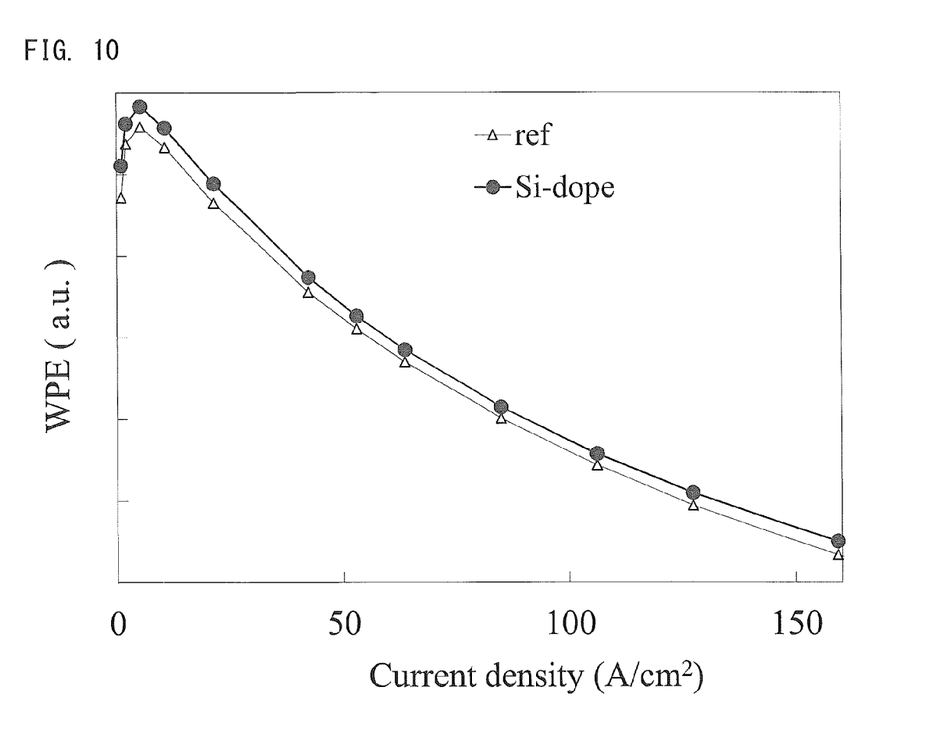
FIG. 10 is a graph comparing the wall plug efficiency between the light-emitting device according to Embodiment 2 and the conventional light-emitting device.

Wall Plug Efficiency (WPE) is given by a formula Po/(I×V). FIG. 10 is a graph showing the current density dependency of Wall Plug Efficiency (WPE). The horizontal axis of FIG. 10 represents a current density (A/cm$^2$). The vertical axis of FIG. 10 represents a Wall Plug Efficiency (WPE). As shown in FIG. 10, the Wall Plug Efficiency (WPE) increases as the current density increases, reaches the maximum value at the current density of approx. 5 (A/cm$^2$), and it decreases as the current density increases. Throughout the measured current density range, the Wall Plug Efficiency (WPE) of the example is higher than the Wall Plug Efficiency (WPE) of the comparative example.

Specifically, as shown in Table 5, the value obtained by dividing WPE of the example by WPE of the comparative example is 1.017 when the current density is 53 (A/cm$^2$), 1.018 when the current density is 106 (A/cm$^2$), and 1.033 when the current density is 212 (A/cm$^2$). That is, the Wall Plug Efficiency (WPE) is improved as a whole by about 1% to 3% in the semiconductor light-emitting device according to the example compared to the conventional semiconductor light-emitting device.

TABLE 5

| Current density (A/cm$^2$) | WPE (example)/WPE (comparative example) |
|---|---|
| 53 | 1.017 |
| 106 | 1.018 |
| 212 | 1.033 |

As described above, the light-emitting device according to the example is superior in the external quantum efficiency, the total radiant flux, and the wall plug efficiency compared to the light-emitting device according to the comparative example.

What is claimed is:
1. A Group III nitride semiconductor light-emitting device, comprising:
a light-emitting layer having a layer unit;
an n-type semiconductor layer; and
a p-type semiconductor layer;
wherein:
the layer unit comprises at least a well layer in which electrons and holes are recombined and a non-doped barrier layer;
the well layer has a first semiconductor layer, a second semiconductor layer disposed at the n-type semiconductor layer side of the well layer and a third semiconductor layer disposed between the first semiconductor layer and the second semiconductor layer;
the first semiconductor layer consists of a non-doped InGaN;
the second semiconductor layer consists of a Si-doped n-type InGaN;
the third semiconductor layer consists of a non-doped InGaN;

the second semiconductor layer is directly contacted with the non-doped barrier layer;
the third semiconductor layer is directly contacted with the second semiconductor layer; and
the first semiconductor layer is directly contacted with the third semiconductor layer, and
wherein the third semiconductor layer includes an In composition ratio that gradually increases toward the first semiconductor layer, and the In composition ratio of the third semiconductor layer is equal to or less than an In composition ratio of the first semiconductor layer.

2. The Group III nitride semiconductor light-emitting device according to claim 1, wherein an In composition ratio of the second semiconductor layer is gradually and continuously increased from the non-doped barrier layer to the third semiconductor layer.

3. The Group III nitride semiconductor light-emitting device according to claim 2, wherein the Si concentration of the second semiconductor layer falls within a range of $1\times10^{17}/cm^3$ to $3\times10^{18}/cm^3$.

4. The Group III nitride semiconductor light-emitting device according to claim 3, wherein the thickness of the second semiconductor layer falls within a range of 2 Å to 10 Å.

5. The Group III nitride semiconductor light-emitting device according to claim 1, wherein the In composition ratio of the third semiconductor layer is gradually and continuously increased from the second barrier layer to the first semiconductor layer.

6. The Group III nitride semiconductor light-emitting device according to claim 1, wherein the In composition ratios Y of the second semiconductor layer and the third semiconductor layer fall within a range of 0.5% to 50% of the In composition ratio X of the first semiconductor layer.

7. The Group III nitride semiconductor light-emitting device according to claim 6, wherein the Si concentration of the second semiconductor layer falls within a range of $1\times10^{17}/cm^3$ to $3\times10^{18}/cm^3$.

8. The Group III nitride semiconductor light-emitting device according to claim 7, wherein the thickness of the second semiconductor layer falls within a range of 2 Å to 10 Å.

9. The Group III nitride semiconductor light-emitting device according to claim 8, wherein the light-emitting layer comprises a multiple quantum well structure in which a plurality of layer units are repeatedly deposited.

10. The Group III nitride semiconductor light-emitting device according to claim 1, wherein the layer unit comprises:
a first AlGaN layer which is the non-doped barrier layer;
a GaN layer directly contacted with the first semiconductor layer and
a second AlGaN layer directly contacted with the GaN layer.

11. The Group III nitride semiconductor light-emitting device according to claim 1, wherein the Si concentration of the second semiconductor layer falls within a range of $1\times10^{17}/cm^3$ to $3\times10^{18}/cm^3$.

12. The Group III nitride semiconductor light-emitting device according to claim 1, wherein the thickness of the second semiconductor layer falls within a range of 2 Å to 10 Å.

13. The Group III nitride semiconductor light-emitting device according to claim 1, wherein an In composition ratio of the second semiconductor layer is gradually and continuously increased from the non-doped barrier layer to the third semiconductor layer and an In composition ratio of the third semiconductor layer is gradually and continuously increased from a maximum In composition ratio of the second semiconductor layer to an In composition ratio of the first semiconductor layer.

14. The Group III nitride semiconductor light-emitting device according to claim 1, wherein the non-doped barrier layer comprises a non-doped AlGaN.

* * * * *